(12) United States Patent
Lo

(10) Patent No.: US 12,484,158 B2
(45) Date of Patent: Nov. 25, 2025

(54) METHOD FOR FORMING SILICON CARBIDE MODULE INTEGRATED STRUCTURE

(71) Applicant: PHIHONG TECHNOLOGY CO., LTD., Taoyuan (TW)

(72) Inventor: Kao Ping Lo, Taoyuan (TW)

(73) Assignee: Zerova Technologies Taiwan Limited, Tainan (TW)

( * ) Notice: Subject to any disclaimer, the term of this patent is extended or adjusted under 35 U.S.C. 154(b) by 622 days.

(21) Appl. No.: 17/887,747

(22) Filed: Aug. 15, 2022

(65) Prior Publication Data
US 2022/0394857 A1 Dec. 8, 2022

Related U.S. Application Data

(63) Continuation-in-part of application No. 16/869,245, filed on May 7, 2020, now abandoned.

(30) Foreign Application Priority Data

Mar. 18, 2020 (TW) .................................. 109109045

(51) Int. Cl.
*H05K 3/34* (2006.01)
*H01L 23/367* (2006.01)
*H01L 23/427* (2006.01)
*H05K 1/02* (2006.01)

(52) U.S. Cl.
CPC ......... *H05K 3/341* (2013.01); *H01L 23/3672* (2013.01); *H01L 23/427* (2013.01); *H05K 1/0203* (2013.01); *H05K 3/3457* (2013.01); *H05K 3/3494* (2013.01)

(58) Field of Classification Search
None
See application file for complete search history.

(56) References Cited

U.S. PATENT DOCUMENTS

| | | | | |
|---|---|---|---|---|
| 6,085,833 | A | * | 7/2000 | Kimura ..................... F28F 3/02 257/722 |
| 2005/0056365 | A1 | * | 3/2005 | Chan .................... H01L 23/3733 257/E21.505 |
| 2020/0006255 | A1 | * | 1/2020 | Nunokawa .......... H01L 23/3121 |
| 2020/0206803 | A1 | * | 7/2020 | Huang ..................... B21J 15/02 |

* cited by examiner

*Primary Examiner* — Daniel Whalen
(74) *Attorney, Agent, or Firm* — WPAT, PC

(57) ABSTRACT

A method for forming a silicon carbide module integrated structure includes a heat sink and a silicon carbide module, which is fixedly connected with the heat sink. The solder paste is arranged between the heat sink and the silicon carbide module, and the heat sink and the silicon carbide module are hot pressed through a welding process to weld the silicon carbide module and the heat sink together.

9 Claims, 11 Drawing Sheets

METHOD FOR FORMING SILICON CARBIDE MODULE INTEGRATED STRUCTURE

CROSS REFERENCE TO RELATED APPLICATION

This present application is a continuation-in-part of U.S. patent application Ser. No. 16/869,245, filed on May 7, 2020, the present application is based on, and claims priority from above-mentioned application.

TECHNICAL FIELD

The present invention relates to a silicon carbide module, especially relates to a silicon carbide module integrated with a heat sink and the method thereof, so as to achieve the purpose of rapidly reducing the temperature of silicon carbide module.

BACKGROUND

Silicon carbide (SiC) elements have the advantages of high voltage, high frequency and high efficiency as operates, which can also improve the efficiency as shrinks the size of device. On the other hand, silicon carbide (SiC) also has advantages in breakdown field strength, width of energy gap, saturation speed for electron, melting point and thermal conductivity, so it becomes a new material option for electronic components.

In addition, electronic products continue to develop towards miniaturization and lightweight, and the integration degree of semiconductor components is rising higher and higher. However, highly integrated semiconductor components need high power to operate, and the heat energy per unit volume also increases with the raised integration degree.

The common heat sink usually has multiple fins. In order to further improve the efficiency of heat dissipation, the heat sink is attached with fans, heat pipes or water-cooling system. However, as the semiconductor components are only in contact with the heat sink or shell by applying pressure, the actual contact area between them will be far smaller than the total area of the contact surface due to the tiny defects on the contact surface. Therefore, the gap between them will be filled with air with high thermal resistance, so that the heat generated by the semiconductor components cannot be efficiently transmitted to the heat sink or shell.

In order to solve the above problems, a heat dissipation cream is usually coated on the contact surface to fill the tiny defects on the contact surface, and thereby significantly improving the effective heat dissipation area between the semiconductor components and the heat sink, and reducing the thermal resistance. Most of the heat dissipation cream sold in the market includes insulating materials such as epoxy resin, silicone oil or paraffin oil as carriers, and adding metal powder and metal oxide powder to improve the heat conduction properties. However, the thermal conductivity and thermal impedance of the heat dissipation cream made of the above materials are limited; that is to say, the thermal conductivity of the heat dissipation cream is low (K=2.5), and the heat transfer effect is poor, which cannot meet the requirements of high thermal efficiency of electronic products.

Therefore, based on the demand in the current market, and improving the disadvantages of conventional materials, the invention proposes a new structure and solution.

SUMMARY OF THE INVENTION

In order to overcome the drawbacks of the prior arts, the invention proposes a structure and method of combining a silicon carbide module with a heat sink by using solder paste, and the combined structure prepared by the method can overcome the limitation of the heat conduction property of the traditional heat dissipation cream.

According to one aspect of the invention, a device of a silicon carbide module integrated with a heat sink, comprising a heat sink; a silicon carbide module configured to the heat sink; and solder paste arranged between the heat sink and the silicon carbide module such that the heat sink is attached on the silicon carbide module.

In the invention, the heat sink and the silicon carbide module are hot pressed through a welding process to weld the silicon carbide module and the heat sink together. An operation temperature of the welding process is a range of 130° C. to 140° C. The heat sink has a base plate and a plurality of fins arranged on the base plate, and the base plate is made of copper or copper alloy. The plurality of fins are rod-shaped fins, and the plurality of fins are made of aluminum or aluminum alloy. The heat sink is integrally formed, including a base plate, a cover plate and a plurality of heat conducting fins fixed between the base plate and the cover plate. The plurality of heat conducting fins are needle shaped, column shaped or sheet-like heat conducting fins. The solder paste includes solder powder and flux.

According to another aspect of the invention, a method of combining a silicon carbide module with a heat sink comprises providing a silicon carbide module. Then, solder paste is arranged on the silicon carbide module. Next, a heat sink is placed on the silicon carbide module such that a surface of the heat sink contacts with the solder paste, wherein the solder paste is configured between the silicon carbide module and the heat sink. Finally, the heat sink and the silicon carbide module are hot pressed to solidify the solder paste such that the silicon carbide module is attached with the heat sink together.

The heat sink and the silicon carbide module are hot pressed through a welding process to weld the silicon carbide module and the heat sink together. An operation temperature of the hot pressing is a range of 130° C. to 140° C. The solder paste includes solder powder and flux, and the solder powder includes Sn—Bi alloy or Sn—Bi—Ag alloy.

According to yet another aspect of the invention, a method for forming a silicon carbide module integrated structure comprises configuring a metal sheet on a first side of a first printed circuit board (PCB) and silicon carbide chips on a second side of the first PCB. Next, the first PCB is attached on a base to form a silicon carbide module. A solder paste is applied on the metal sheet. Subsequently, a heat sink is attached on the metal sheet of the silicon carbide module in an oven such that the solder paste is melted. Finally, the heat sink and the silicon carbide module are cooled to solidify the solder paste such that the heat sink and the silicon carbide module are welded together. A melting temperature of the solder paste is a range of 130° C. to 140° C.

The above description is used to explain the purpose, technical means and the achievable effect of the invention. Those familiar with the technology in the relevant field can understand the invention more clearly through the following embodiments, the accompanying description of the drawings and claims.

BRIEF DESCRIPTION OF THE DRAWINGS

The present invention can be understood by utilizing several preferred embodiments in the specification, the detailed description and the following drawings. The same element symbols in the drawings refer to the same elements in the present invention. However, it should be understood that all preferred embodiments of the present invention are only used for illustrative purposes, and not intended to limit the scope of the application.

DETAILED DESCRIPTION

Figure 1:
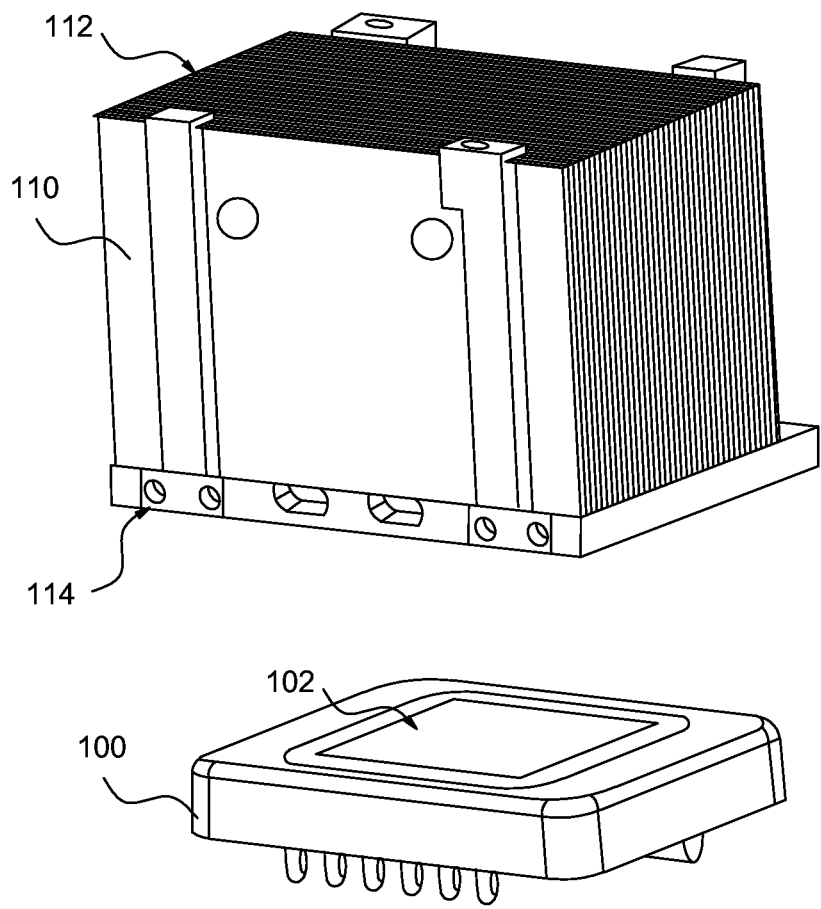
FIG. 1 shows an architecture of a heat sink and a silicon carbide module of the present invention.

In order to give examiner more understanding of the features of the present invention and advantage effects which the features can be achieve, some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

The present invention proposes a structure of a silicon carbide module integrated with a heat sink by solder paste to address the issue of poor heat transfer effect of heat dissipation cream or thermal silicon film as a material of heat transfer. The solder paste is used as heat conduction material and the heat sink is integrated on the silicon carbide module to improve the heat dissipation effect of the whole silicon carbide module.

The means of the invention: when the temperature of the silicon carbide module is too high, the load must be lowered to avoid the burning of the electronic components; however, the heat transfer effect of the heat dissipation cream or thermal silicon film is not good due to low coefficient of thermal conductivity (K=2.5) of the heat dissipation cream; therefore, the invention applies solder paste which can be melted at low temperature (130° C.~140° C.) between the silicon carbide (SiC) module and the heat sink by using a low-temperature welding technology, and then heats to melt the solder paste, so that the silicon carbide (SiC) module and the heat sink are welded together.

The effect of the invention: the high temperature generated by the silicon carbide module when it is electrified can be transmitted to the heat sink through the metal solder/ solder paste with high coefficient of thermal conductivity heat conductivity (K>40), so that the heat sink can have a better heat dissipation effect, and thereby reducing the temperature of the silicon carbide module.

The silicon carbide module of the invention includes silicon carbide (SiC) electronic components, such as SiC power component, power control unit (PCU), inverter, vehicle charger, etc. The silicon carbide module comprises a silicon carbide (SiC) substrate, a silicon carbide (SiC) component or a combination thereof. The electronic components made of silicon carbide (SiC) have three advantages: reducing the energy loss in the process of power conversion, easily achieving miniaturization, and more resistant to high temperature and high pressure. Most 5G communication products have the characteristics of high power, high pressure and high temperature, so most of them use silicon carbide (SiC) components. The silicon carbide module integrates a plurality of silicon carbide (SiC) components thereon. For example, the silicon carbide module is a silicon carbide (SiC) power module, silicon carbide (SiC) semiconductor module, silicon carbide (SiC) discrete semiconductor module, etc.

Please refer to FIG. 1, it shows the architecture of the heat sink and the silicon carbide module of the present invention. In this embodiment, the silicon carbide module structure with high thermal conductivity includes a silicon carbide module 100, solder paste 102 and a heat sink 110. In this embodiment, the silicon carbide module 100 is a silicon carbide (SiC) substrate.

The heat sink 110 may be thermally conductive and may have a first outer surface 112 and a second outer surface 114 substantially parallel to the first outer surface 112. The second outer surface 114 of the heat sink 110 may be a weldable portion which may be welded on the back side of the silicon carbide module 100. The material of the heat sink 110 is selected from a material with thermal conductivity and weldability, such as metal. The heat sink 110 is made of a heat conducting material. The structure of the heat sink 110 is designed to be facilitated for welding on the silicon carbide module 100 and for heat dissipation of the electronic components on the silicon carbide module 100.

In one embodiment, the heat sink 110 has a base plate (substrate) made of copper or copper alloy and a plurality of rod-shaped fins made of aluminum or aluminum alloy arranged on the base plate.

In one embodiment, the heat sink 110 is integrally formed, including a base plate, a cover plate and a plurality of needle shaped, column shaped, sheet-like or other shaped heat conducting fins fixed between the base plate and the cover plate, which extend from the base plate. The base plate or the fins are made of materials with good thermal conductivity, such as copper, aluminum and other metals.

In another embodiment, the heat sink 110 includes a base plate and a plurality of heat conducting fins, which are manufactured separately from the base plate to increase the heat conducting area of the fins, and then the fins and the base plate are welded to combine together to complete the manufacture of the heat sink.

The invention adopts a material of the solder paste 102 which can be melted at a low temperature. For example, the solder paste 102 can be melted at a temperature of 130° C.~140° C. In one embodiment, the material of the solder paste 102 includes solder powder and flux. In one example, the low-temperature solder paste 102 includes a solder powder of Sn—Bi alloy or Sn—Bi—Ag alloy, wherein Sn—Bi alloy has Sn (42%), Bi (58%) and a melting point of 138° C. The content of Bi in low temperature solder paste 102 is between 0% and 58%. As the content of Bi is within this range, the characteristics of thermal cycling can be improved. The solder powder of the invention is preferably 35-95% of the total mass of the low temperature solder paste 102.

A solvent contained in the flux can mix all the constituent materials of the solder paste 102 together to form a paste form. In addition, the flux can also facilitate to remove oxides and impurities on the metal surface, and can form a film on the metal surface to isolate the air, so that the solder paste is not easy to oxidize. The content of flux is preferably 5-60% of the total mass of the low temperature solder paste 102.

In one embodiment, the low temperature solder paste 102 includes a flux composition. The flux composition can be any of organic acid, amine, amine halide, organic halogen compound, thixotropic agent, rosin, solvent, interfacial agent, base agent, polymer compound, silane coupling agent, colorant, or the combination of more than two. Organic acid includes but not limited to: succinic acid, glutaric acid, adipic acid, heptanoic acid, succinic acid, azelaic acid, sebacic acid, dimeric acid, propionic acid, 2,2-dihydroxymethylpropionic acid, tartaric acid, malic acid, glycolic acid, diethanolic acid, thioglycolic acid, dithioglycolic acid, stearic acid, 12-hydroxystearic acid, palmitic acid, oleic acid, etc. Amine halide is a compound by the reaction of amine and hydrogen halide, in which amine is ethylamine, ethylenediamine, triethylamine, methylimidazole, 2-ethyl-4-methylimidazole, etc., while hydrogen halide is hydride of chlorine, bromine, iodine, etc. Organic halogen compound includes but not limited to: 1-bromo-2-butanol, 1-bromo-2-propanol, 3-bromo-1-propanol, 3-bromo-1,2-propanediol, 1,4-dibromo-2-butanol, 1,3-dibromo-2-propanol, 2,3-dibromo-1-propanol, 2,3-dibromo-1,4-butanediol, 2,3-dibromo-2-butene-1,4-diol, etc. Thixotropic agent includes such as wax thixotropic agent or amide thixotropic agent. Rosin is for example rubber rosin, wood rosin or tall oil rosin, and the derivatives obtained from the raw material rosin. The solvent is water, alcohol, glycol ether, terpene alcohol, etc. Interfacial agent is such as polyoxyalkylacetylene alcohols, polyoxyalkylglycerides, polyoxyalkylalkylethers, polyoxyalkylesters, polyoxyalkylamines, polyoxyalkylamides, etc.

In another embodiment, the flux includes the following four compositions: (1) resin rosin: including natural resin (rosin) or synthetic rosin, usually lead solder paste having natural resin, while lead-free solder paste having synthetic rosin, rosin can form a protective layer on the surface of the weld metal to isolate air to prevent oxidation; (2) activator: including organic acid and halogen having the ability to clean the metal surface, dissolve the oxides on the metal surface, to improve the welding effect; (3) solvent: including ethanol, water which can facilitate to dissolve and mix different chemicals in the flux, make the coating of the flux more uniform, improve the effect of the flux, and control the viscosity and fluidity of the solder paste, and the solvent will be evaporated during the preheating process of the solder paste, which will not affect the solderability of the whole solder paste; (4) rheology modifier: it provides thixotropy to control the viscosity of the solder paste, enhance the anti-collapse property of the solder paste, so that the solder paste printed on the silicon carbide (SiC) module can still maintain its original shape without affecting the thermal conductivity due to collapse.

In one embodiment, the solder paste 102 is first configured in paste form on the silicon carbide (SiC) module 100. For example, through a solder paste printer, the solder paste 102 is printed (added) on the silicon carbide (SiC) module 100. Then, the heat sink 110 is placed on the silicon carbide (SiC) module 100, and the second outer surface 114 of the heat sink 110 is directly contacted with the solder paste 102 so that the solder paste 102 is configured (arranged) between the silicon carbide (SiC) module 100 and the heat sink 110. The paste like solder paste 102 can be used to adhere to the surface (non-electronic components surface) of the silicon carbide (SiC) module 100 and the second outer surface 114 of the heat sink 110 placed on the silicon carbide (SiC) module 100, so that the heat sink 110 and the silicon carbide (SiC) module 100 are not in moving even under some slight vibration. The coating amount, position and area of the solder paste 102 can be determined according to the situation, so as to achieve the best viscosity and heat conduction effect of the solder paste 102.

Figure 2:
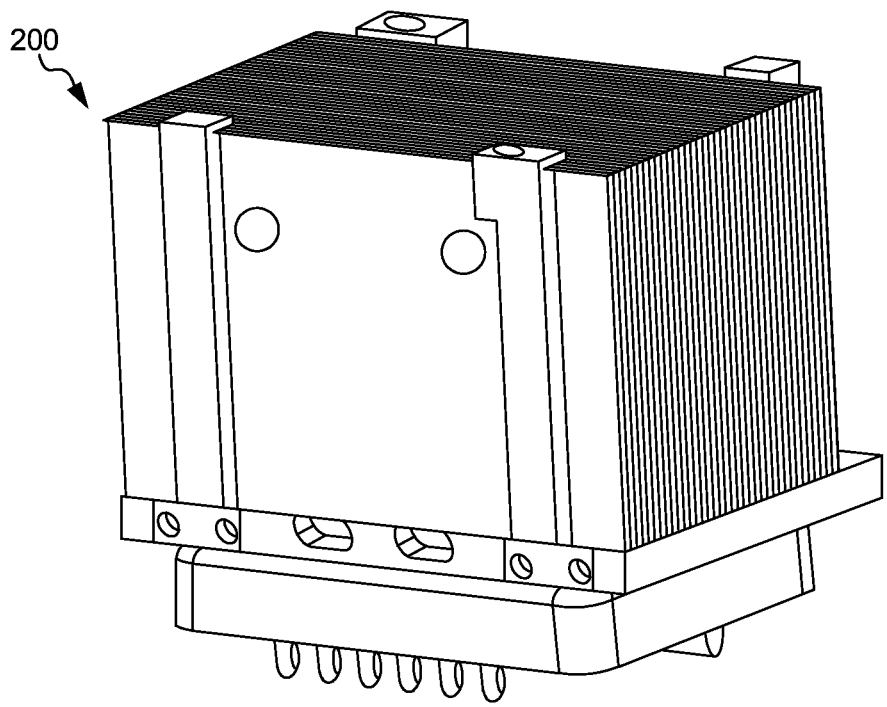
FIG. 2 shows a combined structure of the silicon carbide module combined with the heat sink of the present invention.

Then, a heating welding device is used to perform a low-temperature welding process, for example, the operating temperature is 130° C.~140° C., to heat the solder paste 102 applied and configured between the silicon carbide (SiC) module 100 and the heat sink 110; during the heating and welding process, the silicon carbide (SiC) module 100 and the heat sink 110 are hot pressed to make the solder paste 102 completely solidified and connect the silicon carbide (SiC) module 100 and the heat sink 110, so as to the heat sink is integrated on the silicon carbide (SiC) module 200, as shown in FIG. 2. The solder paste 102 can be melted at 130° C.~140° C., so the melted solder paste 102 can be welded between the silicon carbide (SiC) module 100 and the heat sink 110; and the melted solder paste 102 can be evenly distributed between the silicon carbide (SiC) module 100 and the heat sink 110 to achieve the purpose of uniform heat conduction and dissipation.

Figure 3:
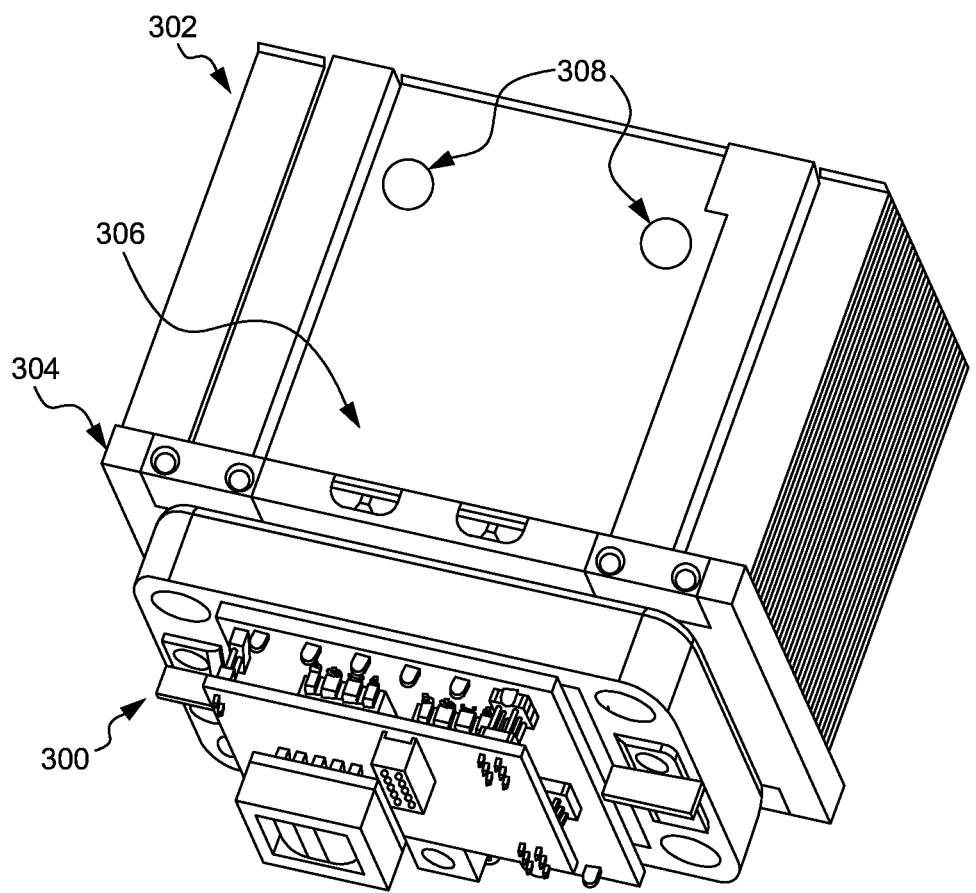
FIG. 3 shows a combined structure of the silicon carbide module combined with the heat sink of another embodiment of the present invention.

In another embodiment, as shown in FIG. 3, the heat sink 302 is integrated on the package structure of the silicon carbide module 300. In one embodiment, the heat sink 302 includes a substrate 304, heat conducting fins 306 and heat pipe 308. For example, one end of the heat pipe 308 is connected with the heat conducting fins 306 so that the heat absorbed by the heat pipe 308 can be transferred to the heat conducting fins 306 for heat dissipation. The heat pipe 308 is made of a material with high thermal conductivity, such as copper or aluminum. The heat pipe 308 can be filled with a working liquid, for example water, alcohol or other liquid with low boiling point, so that the working liquid can absorb heat from the liquid and evaporate into a gaseous phase. The inner wall of the heat pipe 308 can be a wire mesh, a micro groove and other capillary structures to facilitate the working liquid for circulating. The number of the heat conducting fins 306 and the heat pipes 308 can be determined according to different situations or structures. In this embodiment, the substrate 304 is a copper base plate, and the heat conducting fins 306 are heat dissipating aluminum fins. The heat dissipating aluminum fins 306 are internally inserted with two heat pipes 308 connected to the copper base plate 304. The package structure of silicon carbide module 300 includes electronic components made of silicon carbide (SiC) substrate material, such as silicon carbide (SiC) power components, power control unit (PCU), inverter, vehicle charger, etc. The silicon carbide electronic components are encapsulated on the upper surface of the silicon carbide module 300, and then the solder paste between the silicon carbide (SiC) module 300 and the heat sink 302 is heated and coated by the low-temperature welding technology, and the heat sink 302 is welded on the back side of the encapsulated silicon carbide module 300 to complete the silicon carbide module packaging structure with high heat dissipation.

The structure of the invention is to first weld a copper sheet on an upper surface of a printed circuit board (PCB) and SiC chips are welded on a lower surface of the PCB, and then a low-temperature welding technology is performed to weld a heat sink with heat pipes to the copper sheet on the PCB. The copper sheet is firmly connected to the heat sink by metal welding. In the traditional structure, the PCB is directly combined with heat sink by a heat dissipation cream for heat conduction, and the other metal solder is also used for heat conduction. However, the difference in heat conductivity between the heat dissipation cream and the metal solder is exceeding twenty times, and the heat sink will be separated from the PCB under external force. The method of the invention can avoid the drawbacks of the traditional heat dissipation structure.

In the invention, the silicon carbide module and the heat sink are joined together by a low-temperature welding process. The low-temperature welding process is employed because the heat pipe in the heat sink and the glue encapsulated in the silicon carbide module cannot withstand a high temperature of more than 180 degrees.

Figure 4:
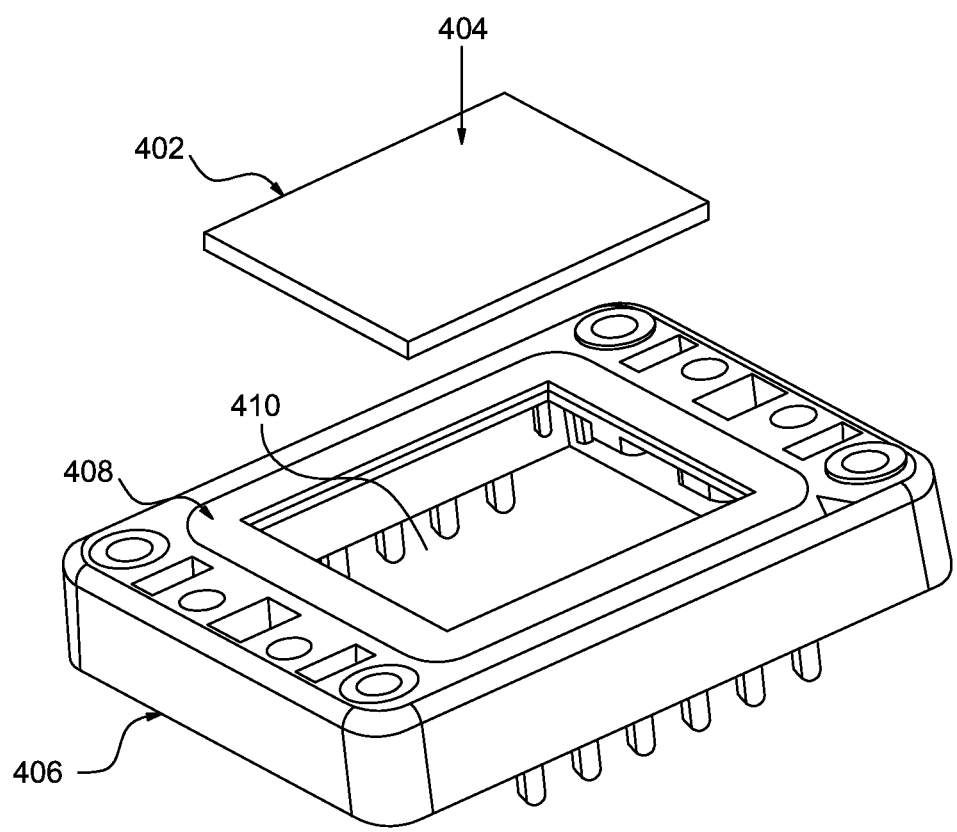
FIGS. 4-7 show an illustration of the process flow for forming a silicon carbide module structure of the present invention.
Figure 5:
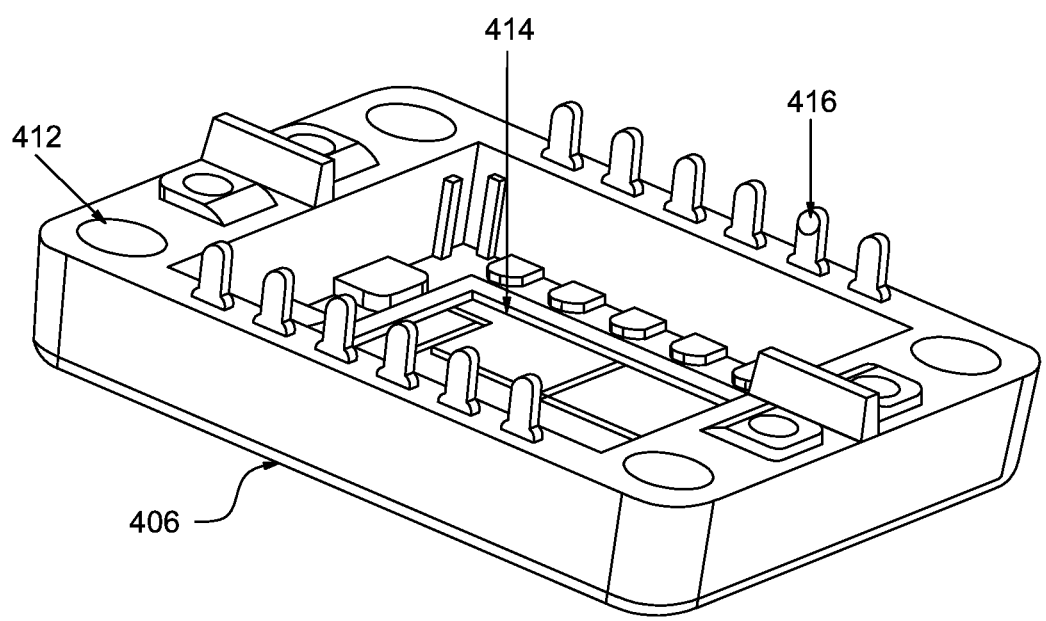
Figure 6:
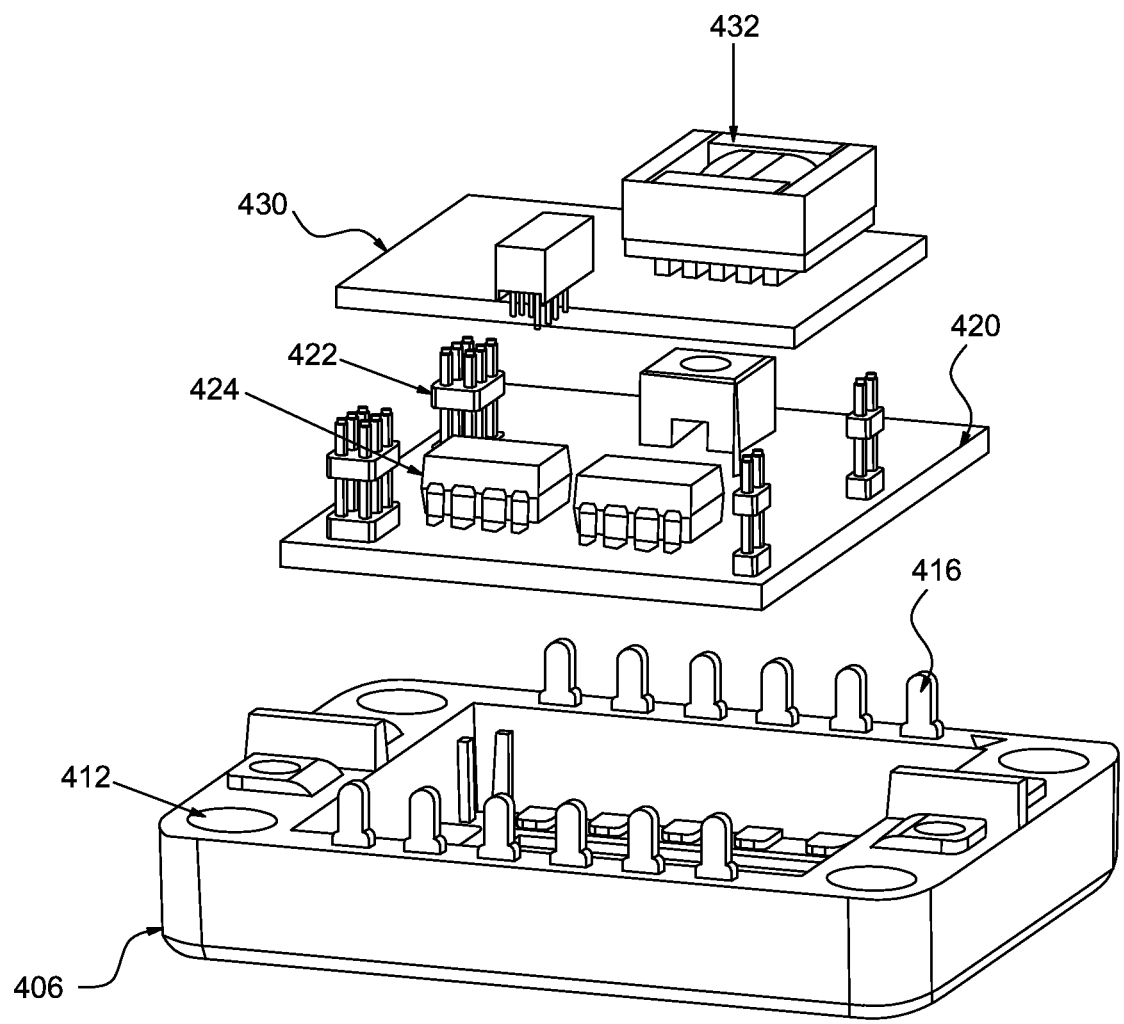
Figure 7:
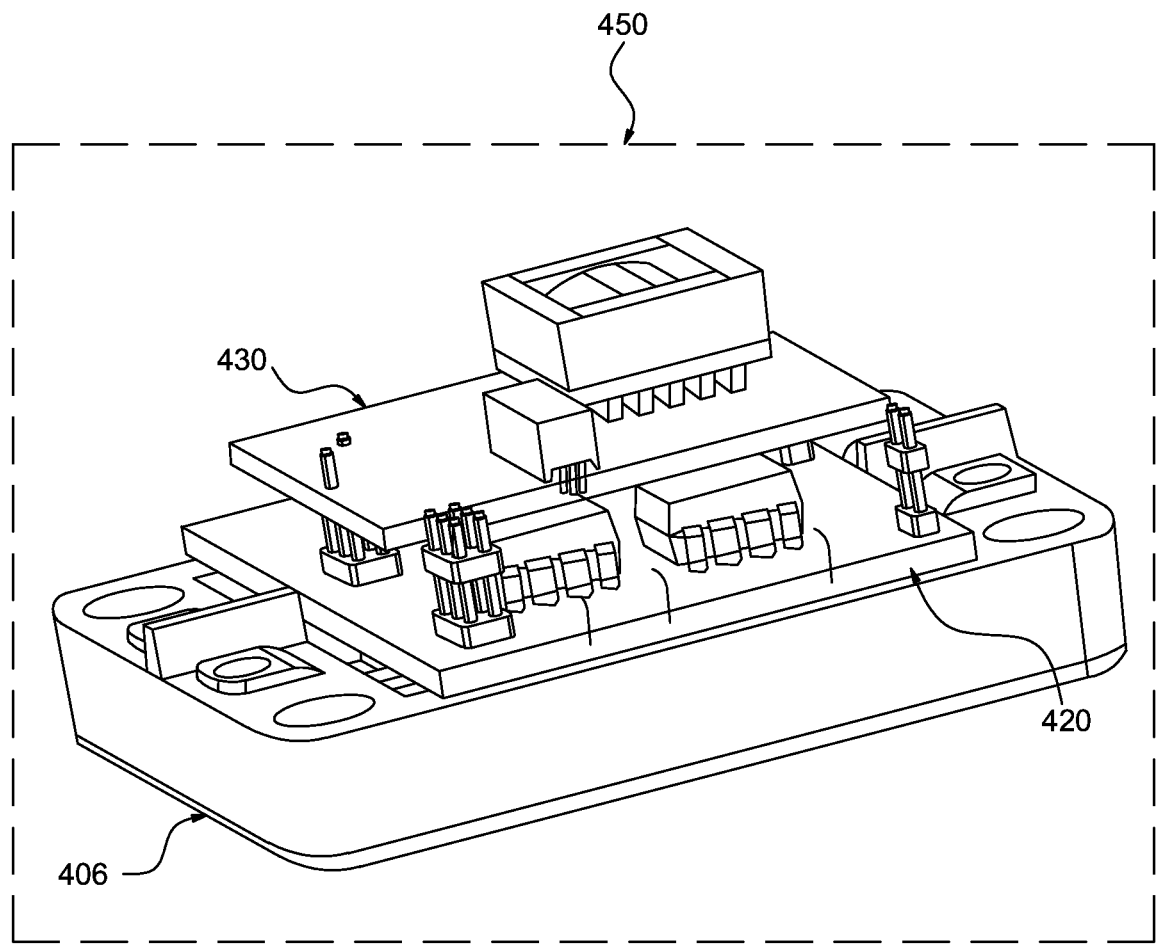

Please refer to FIG. 4 to FIG. 7, they depict an illustration of the process flow for forming a silicon carbide module structure of the present invention. As shown in FIG. 4, a first printed circuit board (PCB) 402 is placed above a plastic base 406. A metal sheet (copper sheet) 404 is welded on an upper surface of the first PCB 402 and SiC chips (not shown) are welded on a lower surface of the first PCB 402. That is, two-sides of the first PCB 402 are configured with the copper sheet and the SiC chips. The first PCB 402 is then attached on a first side 408 of the plastic base 406, wherein the copper sheet is outside of the plastic base 406 and the SiC chips are exposed within an opening 410 of the plastic base 406. Next, a conductive wire 414 is wired bonding on the first PCB 402 at a second side 412 of the plastic base 406, as shown in FIG. 5. The second side 412 is opposite to the first side 408. A sealant, such as silicone glue, is poured into the plastic base 406 to encapsulate with the conductive wire 414 for packaging. A second printed circuit board (PCB) 420 and a third printed circuit board (PCB) 430 are prepared to welded on the plastic base 406, as shown in FIG. 6. Subsequently, a first side (lower surface) of a second printed circuit board (PCB) 420 is welded on a plurality of stands 416 of the plastic base 406, and a first side (lower surface) of a third printed circuit board (PCB) 430 is welded on a plurality of stands 422 of the second PCB 420 to form the silicon carbide module structure 450, as shown in FIG. 7. SiC chips 424 are welded on a second side (upper surface) of the second PCB 420, opposite to the first side of the second PCB 420, as shown in FIG. 6. In FIG. 6, electronic components, such as transformer 432, are welded on a second side (upper surface) of the third PCB 430, opposite to the first side of the third PCB 430.

Figure 8:
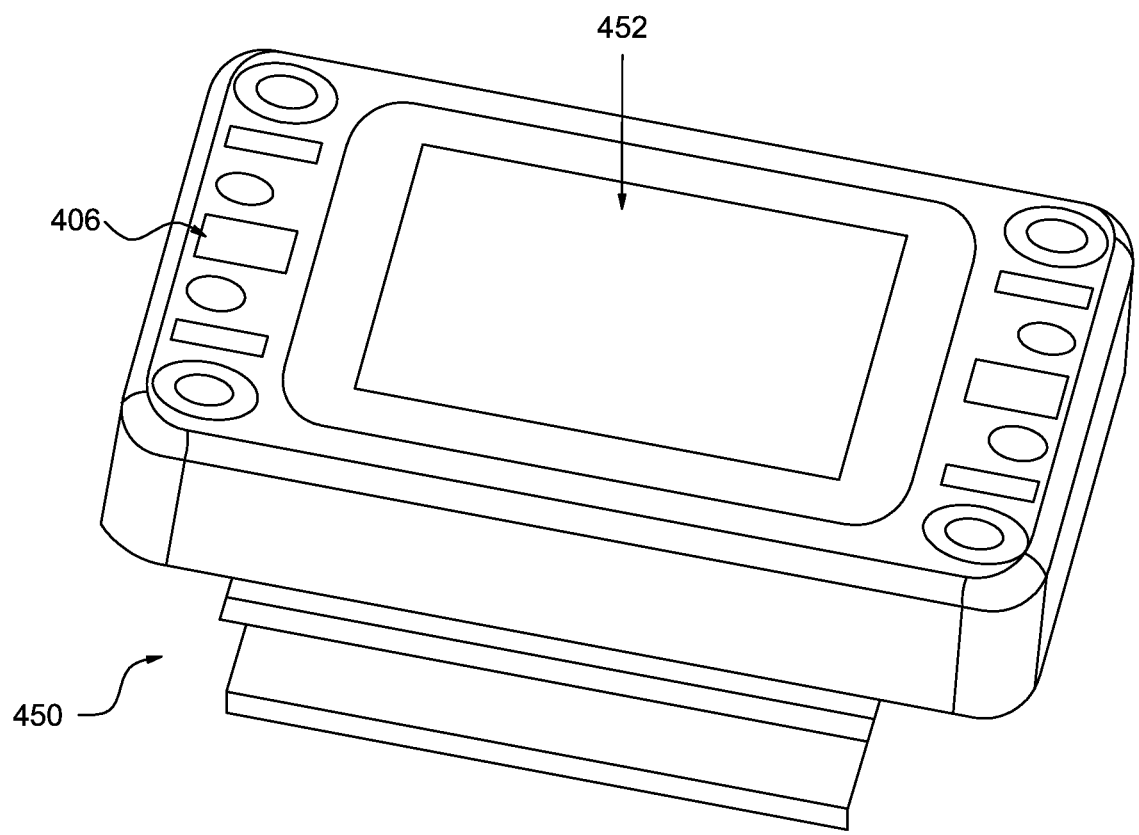
FIGS. 8-11 show an illustration of the process flow for forming a silicon carbide module integrated structure of the present invention.
Figure 9:
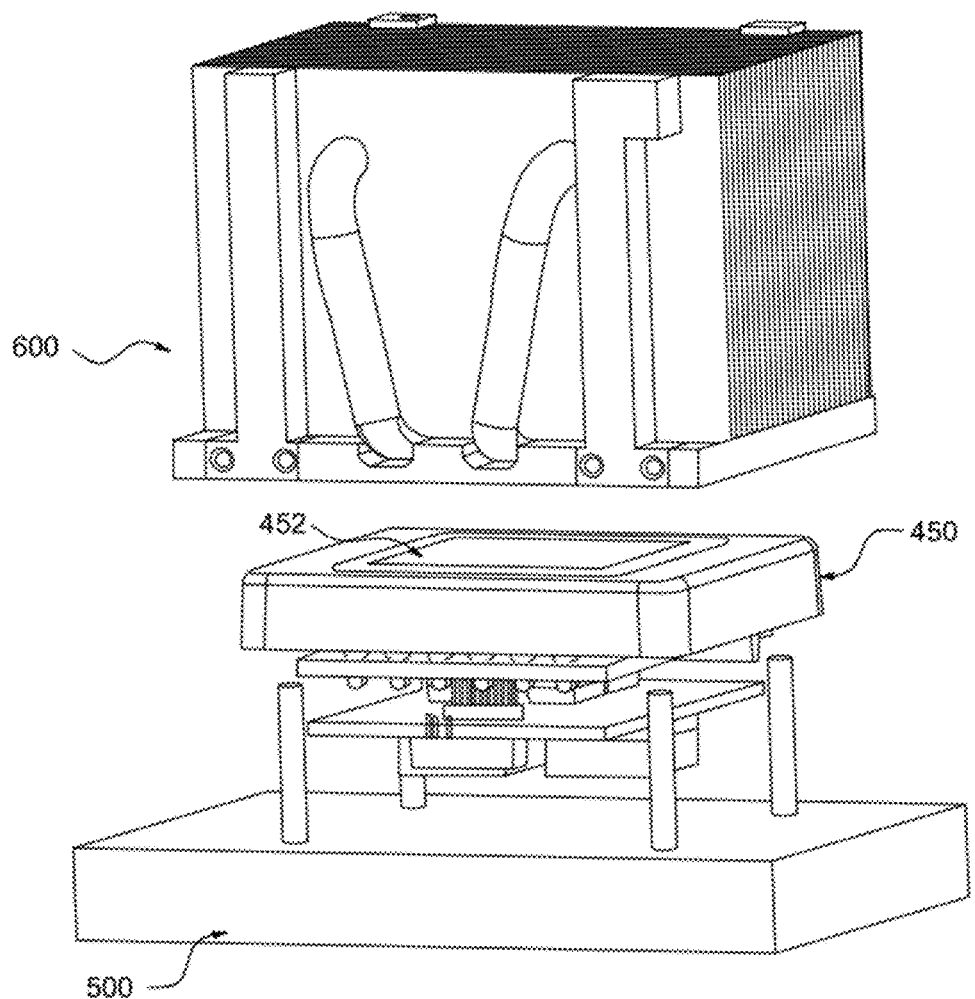
Figure 10:
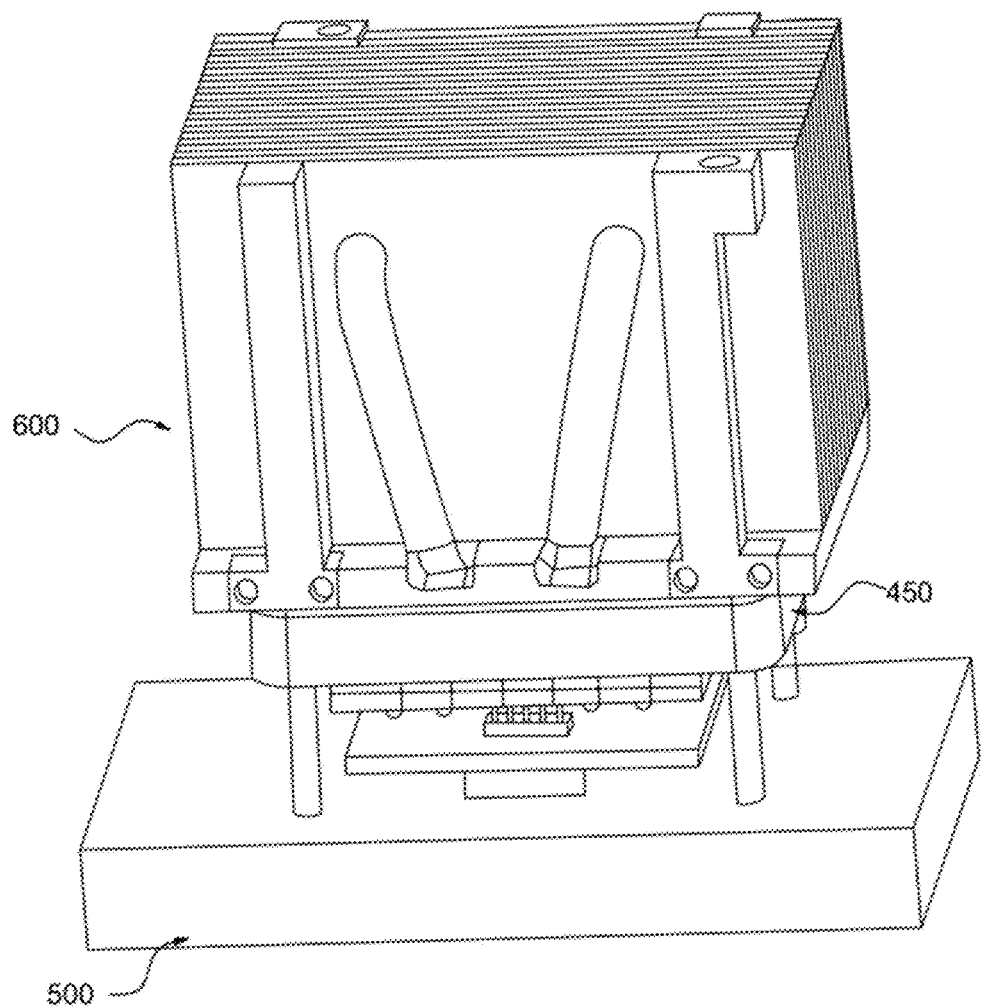
Figure 11:
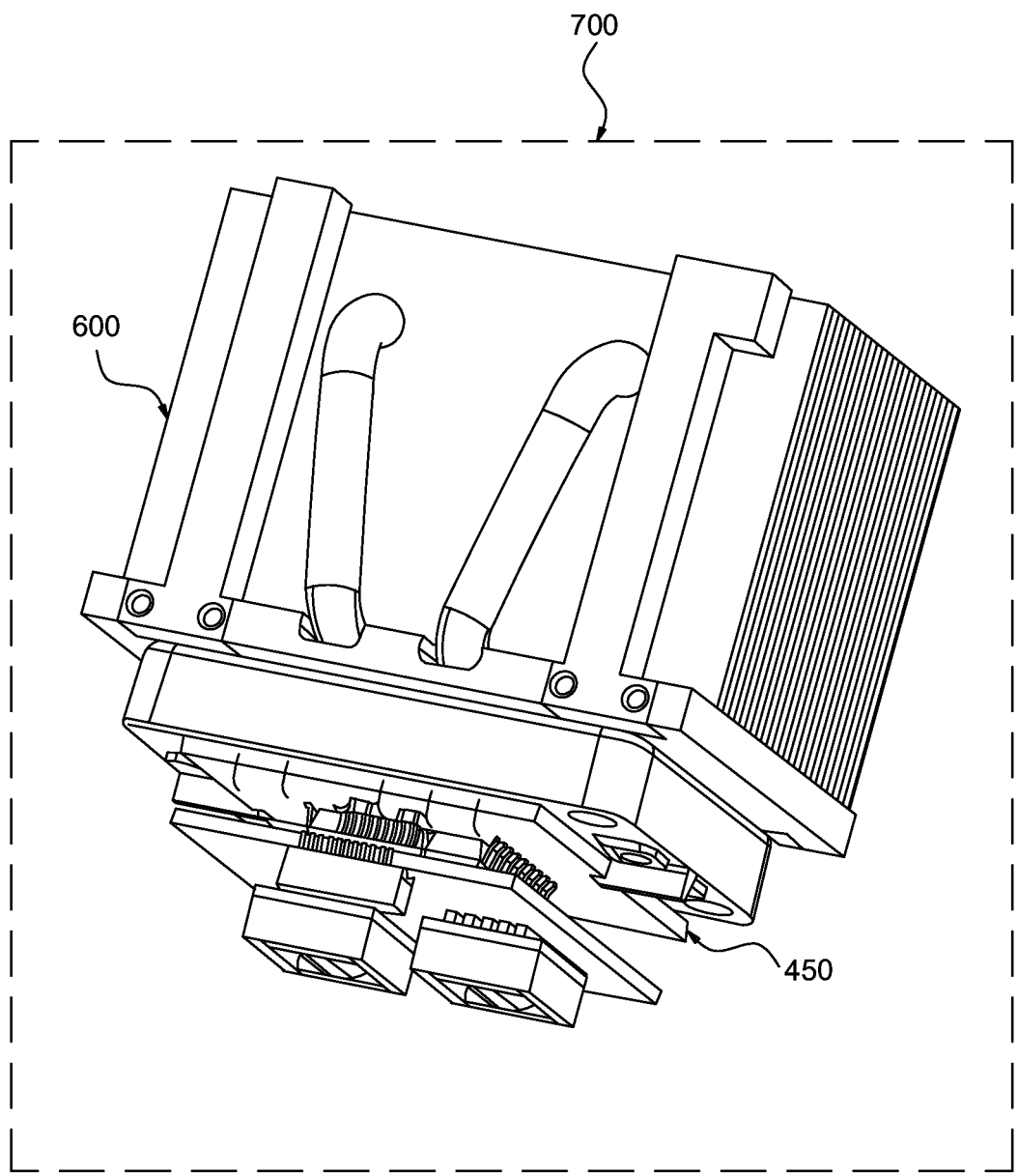

Please refer to FIG. 8 to FIG. 11, they depict an illustration of the process flow for forming a silicon carbide module integrated structure of the present invention. As shown in FIG. 8, a solder paste 452, which can be melted at a low melting temperature (130° C.~140° C.), is applied on the copper sheet 404 of a back side of the silicon carbide module structure 450. Then, the silicon carbide module structure 450 and a heat sink 600 is fixed on a jig or tool 500, as shown in FIG. 9. Next, the heat sink 600 is attached (pressed) on the copper sheet 404 of the silicon carbide module structure 450 fixed on the jig 500 in an oven at the low melting temperature (130° C.~140° C.), and therefore the solder paste 452 is melted and evenly distributed between the heat sink 600 and the silicon carbide module structure 450, as shown in FIG. 10. Finally, after cooling, the solder paste 452 is gradually solidified, and the heat sink 600 and the silicon carbide module structure 450 can be welded together to form the silicon carbide module integrated structure 700, as shown in FIG. 11.

In the process of low-temperature welding, the solder paste that can be melted at low melting temperature (130~140° C.) is applied between SiC module and heat sink, and then heat it to melt the solder paste, so that SiC module and heat sink are welded together.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described. The illustrated elements or components may also be arranged in different arrangements or orders, including the reordering of any fields or the modification of field sizes.

What is claimed is:

1. A method for forming a silicon carbide module integrated structure, comprising:
configuring a metal sheet on a first side of a first printed circuit board (PCB) and silicon carbide chips on a second side of said first PCB;
attaching said first PCB on a first side of a base to form a silicon carbide module;
applying a solder paste on said metal sheet;
attaching a heat sink on said metal sheet of said silicon carbide module in an oven such that said solder paste is melted;
welding a second printed circuit board (PCB) on a plurality of first stands of said base;
welding a third printed circuit board (PCB) on a plurality of second stands of said second PCB;
cooling said heat sink and said silicon carbide module to solidify said solder paste such that said heat sink and said silicon carbide module are welded together; and
wherein a melting temperature of said solder paste is in a range of 130° C. to 140° C.

2. The method of claim 1, wherein said metal sheet is outside of said base and said SiC chips are exposed within an opening of said base.

3. The method of claim 1, further comprising wire bonding a conductive wire on said first PCB at a second side of said base opposite to said first side of said base and pouring a sealant into said base to encapsulate with said conductive wire.

4. The method of claim 1, further comprising welding said silicon chips on a said second printed circuit board (PCB).

5. The method of claim 4, further comprising welding electronic components on a said third printed circuit board (PCB).

6. The method of claim 1, wherein said heat sink has a base plate and a plurality of heat conducting fins arranged on said base plate.

7. The method of claim 6, wherein said base plate is made of copper or copper alloy.

8. The method of claim 6, wherein said plurality of heat conducting fins are made of aluminum or aluminum alloy.

9. The method of claim 1, wherein said heat sink is integrally formed, including a base plate, a cover plate and a plurality of heat conducting fins configured between said base plate and said cover plate.

\* \* \* \* \*